(12) United States Patent
Khoja et al.

(10) Patent No.: US 8,112,681 B2
(45) Date of Patent: Feb. 7, 2012

(54) METHOD AND APPARATUS FOR HANDLING FUSE DATA FOR REPAIRING FAULTY ELEMENTS WITHIN AN IC

(75) Inventors: Faisal Ramzan Ali Khoja, Sunnyvale, CA (US); Gary Robert Waggoner, San Jose, CA (US); Sauro Landini, San Jose, CA (US); Ramamurti Chandramouli, Saratoga, CA (US)

(73) Assignee: ARM Limited, Cambridge (GB)

( * ) Notice: Subject to any disclaimer, the term of this patent is extended or adjusted under 35 U.S.C. 154(b) by 697 days.

(21) Appl. No.: 12/010,766

(22) Filed: Jan. 29, 2008

(65) Prior Publication Data

US 2009/0190422 A1    Jul. 30, 2009

(51) Int. Cl.
  *G11C 29/00* (2006.01)
  *G11C 17/18* (2006.01)
  *G01R 31/28* (2006.01)

(52) U.S. Cl. ........ 714/710; 714/732; 365/200; 365/201; 365/225.7

(58) Field of Classification Search .................. 714/710, 714/718, 724, 732
See application file for complete search history.

(56) References Cited

U.S. PATENT DOCUMENTS

| | | | |
|---|---|---|---|
| 5,430,679 A * | 7/1995 | Hiltebeitel et al. | 365/200 |
| 6,286,115 B1 * | 9/2001 | Stubbs | 714/718 |
| 6,577,156 B2 | 6/2003 | Anand et al. | |
| 6,768,694 B2 | 7/2004 | Anand et al. | |
| 7,174,486 B2 * | 2/2007 | Adams et al. | 714/710 |
| 7,257,037 B2 * | 8/2007 | Kang | 365/200 |
| 7,308,598 B2 * | 12/2007 | Beattie et al. | 714/5 |
| 7,787,323 B2 * | 8/2010 | Herr et al. | 365/225.7 |
| 2002/0194546 A1 * | 12/2002 | Ooishi | 714/42 |
| 2004/0153900 A1 * | 8/2004 | Adams et al. | 714/710 |
| 2006/0245279 A1 * | 11/2006 | Kang | 365/200 |
| 2006/0294440 A1 * | 12/2006 | Riley | 714/710 |
| 2008/0008015 A1 * | 1/2008 | Darbinyan et al. | 365/200 |
| 2008/0104469 A1 * | 5/2008 | Riley | 714/733 |
| 2008/0186783 A1 * | 8/2008 | Kang et al. | 365/200 |

* cited by examiner

*Primary Examiner* — Jeffrey A Gaffin
*Assistant Examiner* — Daniel McMahon
(74) *Attorney, Agent, or Firm* — Nixon & Vanderhye P.C.

(57) ABSTRACT

The application discloses an integrated circuit comprising: circuitry; a fusebox for storing an array of data identifying faulty elements within said circuitry; at least one fusebox controller for repairing said faulty elements in said circuitry in response to data received from said fusebox; a data communication path linking said fusebox controller with said fusebox; wherein said data stored in said fusebox is compacted data and said at least one fusebox controller comprises a data expander for expanding said compacted data received from said fusebox via said data communication path prior to repairing any faulty elements in said circuitry.

17 Claims, 6 Drawing Sheets

Timing Relation between E Fuse AxB memory, E Fuse Interface, and E Fuse Controller

| Bytes | 7 | 6 | 5 | 4 | 3 | 2 | 1 | 0 |
|---|---|---|---|---|---|---|---|---|
| 0 | 0 | 1 | 1 | 0 | 1 | 1 | 1 | 0 |
| 1 | X | X | 1 | 0 | 0 | 0 | 0 | 0 |
| 2 | 0 | 1 | 0 | 1 | 1 | 0 | 1 | 0 |
| 3 | 0 | 1 | 0 | 1 | 0 | 1 | 0 | 1 |
| 4 | 1 | 0 | 0 | 0 | 0 | 0 | 0 | 1 |
| 5 | X | X | 1 | 1 | 1 | 1 | 0 | 1 |
| 6 | X | X | X | X | X | X | 1 | 0 |
| 7 | X | X | X | X | X | X | X | X |
| 8 | 1 | 1 | 1 | 0 | 0 | 1 | X | X |
| 9 | 1 | 0 | 0 | 1 | 1 | 1 | 0 | 0 |
| 10 | 0 | 1 | 0 | 1 | 0 | 0 | 0 | 1 |
| 11 | X | 1 | 0 | 1 | 1 | 1 | 1 | 1 |
| 12 | X | X | X | X | X | X | X | 0 |
| 13 | X | X | X | X | X | X | X | X |
| 14 | X | X | X | X | X | X | X | X |
| 15 | X | X | X | X | X | X | X | X |

FIG. 5

METHOD AND APPARATUS FOR HANDLING FUSE DATA FOR REPAIRING FAULTY ELEMENTS WITHIN AN IC

TECHNICAL FIELD

The technical field of the invention relates to the repair of faulty elements within circuitry.

BACKGROUND

Faults within circuitry such as memories can be repaired subsequent to manufacture by the use of redundant circuit elements that can be selected by fuse programmable logic to replace the faulty elements. The redundant elements have a cost of circuit area but they do enable production yields of circuits to increase as they allow circuits with some faults to still function correctly.

With the ever decreasing size of circuit elements, faults within them are becoming more likely such that the ability to be able to repair them using fuses is important.

Fuses can take the form of laser programmable fuses that are programmed by vaporising material with a laser, or electrically blown fuses which are programmed by passing a high current through them.

Electronic or E fuses are also known that store a repair signature that identifies a faulty element in a memory, for example, and provides it with an alternative storage address within reconfiguration registers. Thus, data is no longer stored in the faulty element rather it is stored in the redundant location that is identified by the E fuse data. In a system with many memories the size of the fuse box is directly related to the sum of the number of reconfiguration registers for each memory under test.

FIG. 1 shows a Built-In Test and Repair solution for an embedded memory. When repair is desired the controller 6 reads memory repair information from a fusebox 2 via a serial register 4. The Laser Fuse contents are first loaded into the serial shift registers and then serially shifted into the BIST/R controller. The fusebox 2 stores repair information for all of the memories associated with the controller 6. It is becoming common to control many memories, possibly up to 100 with a single controller, thus the amount of data stored in the fusebox is very large.

U.S. Pat. No. 6,577,156 discloses a fuse box in which the repair data is stored in compressed form within the fusebox. When the system wants to use the data, the data is decompressed using a decompressor within the fusebox and is then shifted out to various fuse programmable macros where the data is used to remove faulty memory locations.

U.S. Pat. No. 6,768,694 discloses memory elements within a chip that has a plurality of fuses connected to the memory elements that can be programmed to replace defective memory elements and a fuse controller for programming the fuses.

SUMMARY

A first aspect of the technology described in this application provides an integrated circuit comprising: circuitry; a fusebox for storing an array of data identifying faulty elements within said circuitry; at least one fusebox controller for repairing said faulty elements in said circuitry in response to data received from said fusebox; a data communication path linking said fusebox controller with said fusebox; wherein said data stored in said fusebox is compacted data and said at least one fusebox controller comprises a data expander for expanding said compacted data received from said fusebox via said data communication path prior to repairing any faulty elements in said circuitry.

The inventors recognized that fusebox data for repairing faulty elements in circuitry can be very large and thus, compacting the data is advantageous. Furthermore, although there may be many locations that could be faulty most of them will not be. Data of this sort lends itself well to compaction. Furthermore, expanding the compacted data within the fusebox controller itself which is remote from the fusebox results in less data being transmitted between the fusebox and fusebox controller. The ability to transmit less data provides a fast system in which less power and less time is required to repair the circuitry.

Although, such a system is useful for correcting faults in many different circuitry it is particularly helpful for correcting for faults in data stores. Data stores are being produced with ever increasing storage capacity and ever decreasing size. Restricting size in this way makes faults within the data stores more likely. Being able to correct these faults is clearly advantageous.

In some embodiments the integrated circuit comprises a plurality of fusebox controllers and a plurality of data stores, each of said plurality of fusebox controllers being in data communication with at least one data store, said plurality of fusebox controllers being configured to repair faulty elements in said at least one data store that they are in data communication with in response to said fusebox data.

Although, embodiments are applicable to single fusebox controllers they are particularly applicable to a plurality of fusebox controllers and a plurality of data stores where it is clearly important to compact the data and where decompression of the data in each fusebox controller can be performed efficiently.

In some embodiments, said plurality of fusebox controllers are arranged in parallel such that they communicate with their respective plurality of data stores in parallel with each other.

Arranging the system such that there are a plurality of fusebox controllers for a single fusebox with the fusebox controllers arranged in parallel with each other allows the expanded data to be transmitted in parallel from each fusebox controller and thereby increases the efficiency of the system.

In some embodiments, each of said plurality of fusebox controllers comprises data store data regarding certain properties of an associated data store, said data expanders in each of said plurality of fusebox controllers being adapted to use said data in expanding said compacted data.

If the plurality of fusebox controllers store some of the properties of the data store that they are repairing then the data expanders inside the fuseboxes can use this information to interpret the compacted data and expand it in a suitable way. In this way compaction algorithms that are particularly efficient can be used as the fusebox controllers can infer things based on their knowledge of the data store's properties.

In some embodiments, said integrated circuit comprises a plurality of reconfiguration registers associated with said plurality of data stores, said reconfiguration registers specifying faulty locations and corresponding redundant locations to use as replacement storage locations for said faulty locations said data store data comprising a size of said redundant locations associated with said data store.

If the size of the redundant locations such as redundant registers associated with the data store are known by the fusebox controller then it can interpret data more easily as it will know when data to fill a particular location has finished and therefore that the next bit must relate to something else without this information having to be separately stored or sent from the fusebox to the fusebox controller.

In some embodiments, each of said plurality of fusebox controllers comprises a counter for counting a number of data stores controlled by said fusebox controller, said fusebox controller being adapted to: compare said counter value with a value of data received from said fusebox and in response to said data being equal, to expand said fuse data and output said expanded data to circuit elements associated with said data store for repairing said faulty elements and if said value is not equal to output predetermined values to said circuit elements, said predetermined values being generated by said fusebox controller and indicating no repair of said data store, and to increment or decrement said counter and repeat said steps for each of said data stores controlled by said fusebox controller.

It is also advantageous if the fusebox controller is aware of which data store it is connected to and if it knows that the information stored in the fusebox is stored consecutively for the data stores. If this is the case the data store does not have to be identified with identifying bits in the fusebox rather its position in the storage data array is sufficient to identify it. In a system with many memories the size of a conventional fuse box was directly related to the sum of the number of reconfiguration registers. Many of the memories under test would not have any faults in them. Being able to indicate this with a compacted form of data removes the need to store data for each reconfiguration register even where there are no faults in the related memory.

In some embodiments, said circuit elements associated with said data store comprise reconfiguration registers said reconfiguration registers specifying faulty locations and corresponding redundant locations to use as replacement storage locations for said faulty locations.

Although, the repairs can be done using different sorts of circuit elements reconfiguration registers are particularly useful and are generally used for this purpose.

In some embodiments, said integrated circuit further comprises a fusebox interface for controlling communication of data between said fusebox and said at least one fusebox controller.

The provision of the fusebox interface for controlling the communication of data between the fusebox and the at least one fusebox controller allows a fusebox controller to be used with different fusebox data by simply changing the interface rather than needing to change each of the fusebox controllers. This can lead to a very flexible system.

In some embodiments, said fusebox interface comprises at least one external port for communicating data to a user, said fusebox interface being configured to read data from said fusebox and to permanently write data to said fusebox in response to instructions received from said at least one external port.

It is also advantageous if the fusebox interface comprises an external port that allows a user not only to write to the fusebox but also to receive data from it which he can then analyse. Being able to write to the fusebox which is a permanent memory store may allow users to record information that they wish to record permanently on the chip such as chip identification information.

In some embodiments, said at least one external port comprises at least one of a JTAG port and an IEEE 1500 port.

As the JTAG port or an IEEE 1500 port may already be present on the chip it is useful to use such a port for communicating with the fusebox interface.

In some embodiments, said circuitry comprises a plurality of data stores and said integrated circuit further comprises: a plurality of fusebox controllers each of said plurality of fusebox controllers being in data communication with at least one data store, said plurality of fusebox controllers being configured to repair faulty elements in said at least one data store that they are in data communication with in response to said fusebox data; and said fusebox interface comprises a plurality of ports corresponding to said plurality of fusebox controllers for sending data to and receiving data from said corresponding plurality of fusebox controllers.

In some embodiments, said fusebox interface comprises a plurality of trigger inputs corresponding to said plurality of fusebox controllers for receiving a trigger signal in response to said corresponding fusebox controller powering up, said fusebox interface being responsive to said received trigger signals to request all of said fusebox data related to said corresponding fusebox controller from said fusebox and to transmit said data to said fusebox controller.

The use of trigger inputs corresponding to the plurality of fusebox controllers allows information regarding the different fusebox controllers powering up to be used to repair faulty data in their related data stores in response to a signal. This means that individual controllers can be powered down and then powered up and their repair data set without needing to set it for all of the controllers. This clearly has power advantages.

In some embodiments, said integrated circuit further comprises a plurality of fusebox controllers and a plurality of data stores, each of said plurality of fusebox controllers being in data communication with at least one data store, said plurality of fusebox controllers being configured to repair faulty elements in said at least one data store that they are in data communication with in response to said fusebox data; and wherein said integrated circuit further comprises a plurality of memory test controllers corresponding to said plurality of fusebox controllers for testing each of said at least one data stores in data communication with said corresponding fusebox controller and for generating data identifying said faulty elements in said at least one data stores; said fusebox interface being configured to write said generated data that has been compacted to said fusebox, to permanently store it therein and to retrieve and transmit said compacted data to respective fusebox controllers in response to a reset instruction.

Fusebox controllers are generally related to memory test controllers and the information for the fusebox is generated by the memory test controllers. It is then compacted and a fusebox interface is configured to write the generated data to the fusebox which will permanently store it. The fusebox interface can also be used to retrieve the data and to send it to the fusebox controllers.

The compactor may be on chip or it may be external to the chip. For example it may be a software program run by a user.

In some embodiments, said memory test controller comprises said fusebox controller.

Although the fusebox controller and the memory controller can be separate entities generally it is advantageous if the fusebox controller is within the memory test controller.

In some embodiments, each of said plurality of fusebox controllers and said at least one data store in data communication therewith comprise a group each of said groups and said at least one data store therein being numbered consecutively and said fusebox being configured to store data compacted such that data for each consecutive group and data store is stored consecutively, a storage location storing a value indicating either at least one faulty element or no faulty elements within a particular group, wherein if said bit indicates at least one faulty element a next predetermined number of storage locations indicate repair data size for said group, and if said bit indicates no faulty elements a next storage location stores a value indicating whether a next group comprises any faulty storage locations, each fusebox controller storing data indicating positions and repair data for repairable data stores in said consecutive list.

One effective form of compaction is to number the groups consecutively and then store data compacted such that each storage location corresponds to a next group in the consecutive list. Thus, no information identifying the groups need be stored which is obviously advantageous from a compaction point of view. If there are no faulty elements it is simply one bit that is required per group. If there are faulty elements within a group then that one bit indicates this and it is known at the next predetermined number of bits indicates the amount of repair data that is needed for that group.

In some embodiments, said repair data is stored following said data indicating a number of faults in each data store.

Generally the fusebox data is compacted so that the repair data is at the end of the data indicating the faults. The data store that the repair data relates to is clear as groups are numbered consecutively and information regarding whether repair data and how much repair data for each group is provided earlier in the data store.

A further aspect of the technology described in this application provides a method of repairing faulty elements within an integrated circuit comprising the steps of: reading compacted data from a fusebox storing an array of data identifying faulty elements within circuitry at a fusebox controller remote from said fusebox; expanding said compacted data; repairing said faulty elements in said circuitry using said expanded data.

The above, and other objects, features and advantages will be apparent from the following detailed description of illustrative and example embodiments which is to be read in connection with the accompanying drawings.

BRIEF DESCRIPTION OF THE DRAWINGS

FIG. 5 shows an array of E fuse data stored in an E fusebox.

DETAILED DESCRIPTION

Figure 1:
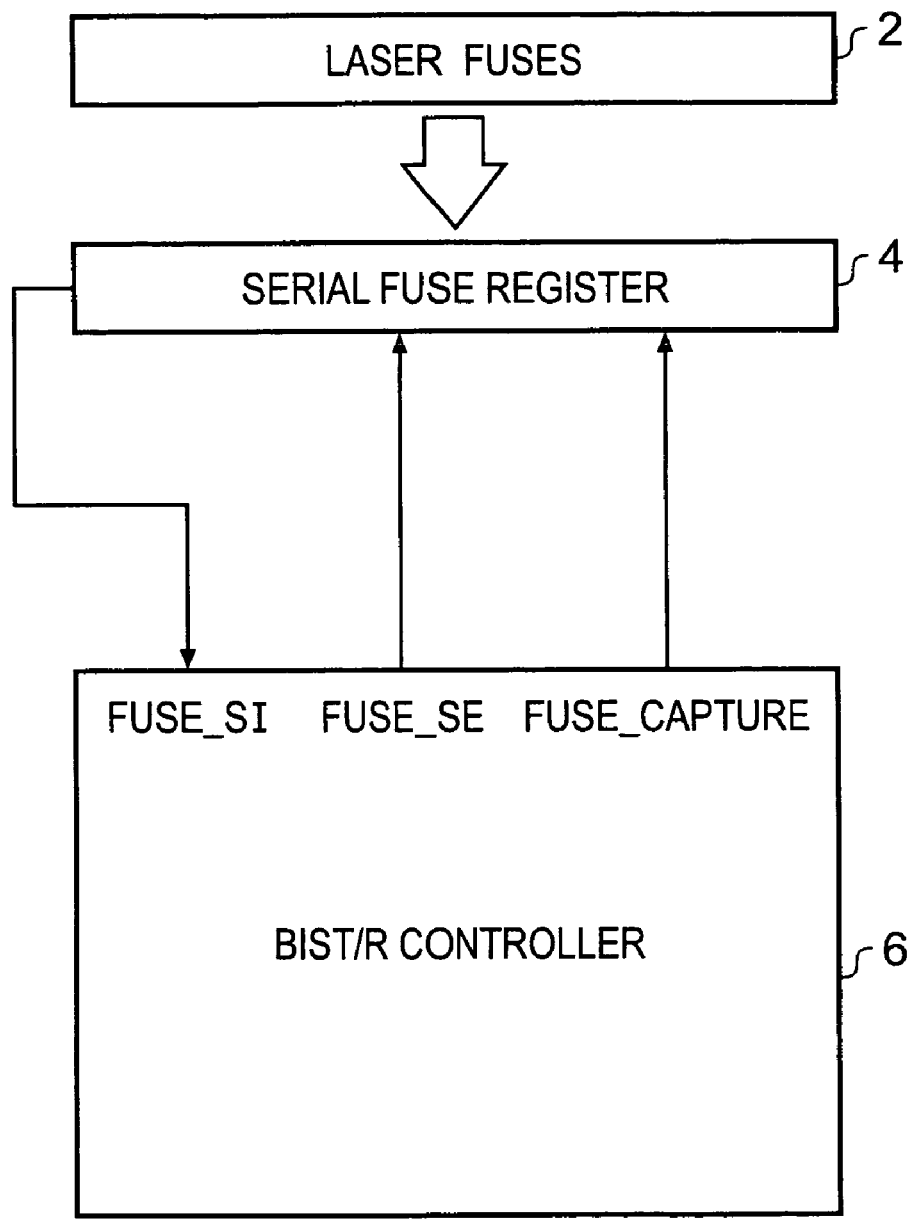
FIG. 1 schematically shows a fusebox and BIST controller.
Figure 2:
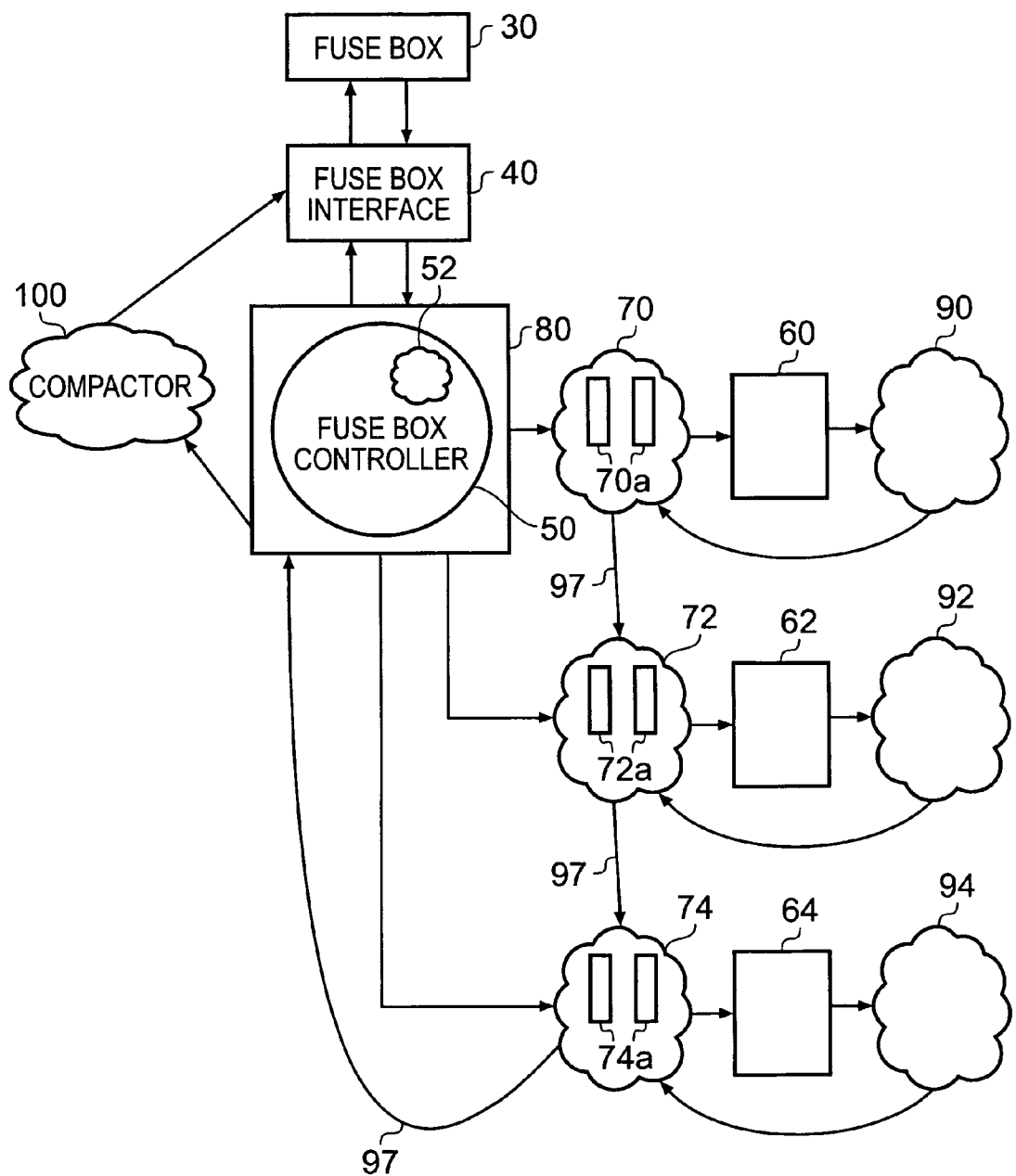
FIG. 2 schematically shows a fusebox, memory controller and associated memories according to a non-limiting, example embodiment.

FIG. 2 shows a fusebox 30, a fusebox interface 40 and a fusebox controller 50 according to a non-limiting, example embodiment. Associated with fusebox controller 50 are three memories 60, 62 and 64. With each of these is associated a wrapper 70, 72 and 74. Each wrapper comprises a number of registers 70A, 72A, 74A. Fusebox controller 50 is contained within memory test controller 80. Memory test controller 80 sends out test data via wrapper 70 to fill the respective memories 60 to 64 and looks at the pattern generated using comparison logic 90 to 94. This comparison logic isolates the faults within the data store 60 to 64 and sends this information back to wrappers 70 to 74. These wrappers populate the reconfiguration registers 70a, 72a, 74a required to compensate for these faults and then perform the tests again with these reconfiguration registers loaded. If the tests are then correct they know that the reconfiguration registers had the right data and this data is shifted out of the wrappers via a path 97 back to memory controller 80. This information is then input to a compactor shown at 100 which may be on an integrated circuit comprising the memories and memory test controller or may be exterior to it. This compactor 100 is generally software and compacts the data as is explained elsewhere in this description. This compacted data is then sent to the fusebox interface 40 which sends it for permanent storage in the fusebox 30, where it is used for repairing the memories 60, 62 and 64.

In response to a reset instruction or user instruction the fusebox interface 40 collects the fusebox data from fusebox 30 and passes it to fusebox controller 50. Compacted data that is received at fusebox controller 50 is then expanded using expansion unit 52 and this data is then loaded into the reconfiguration registers 70A to 74A using wrappers 70 to 74. This data is sent serially via path 97. It should be noted that although only two repair registers are shown in each wrapper, there will generally be more than this. Furthermore, there may also be a bypass register, this allows repair data for wrappers further down the serial wrapper chain to pass through this register rather than passing through all the repair registers.

Although, in this embodiment only one fusebox controller is shown in reality there may be many arranged in parallel as shown in FIG. 3. Furthermore, although only three memories are shown it will be clear to a skilled person that in many embodiments there will be many more memories.

It should be noted that although in this embodiment the fuse data is generated by testing logic on the chip, in other systems it may be generated by an external testing system. In such a case the fuse data is loaded into the fuse box via the JTAG or P1500 ports.

Figure 3A:
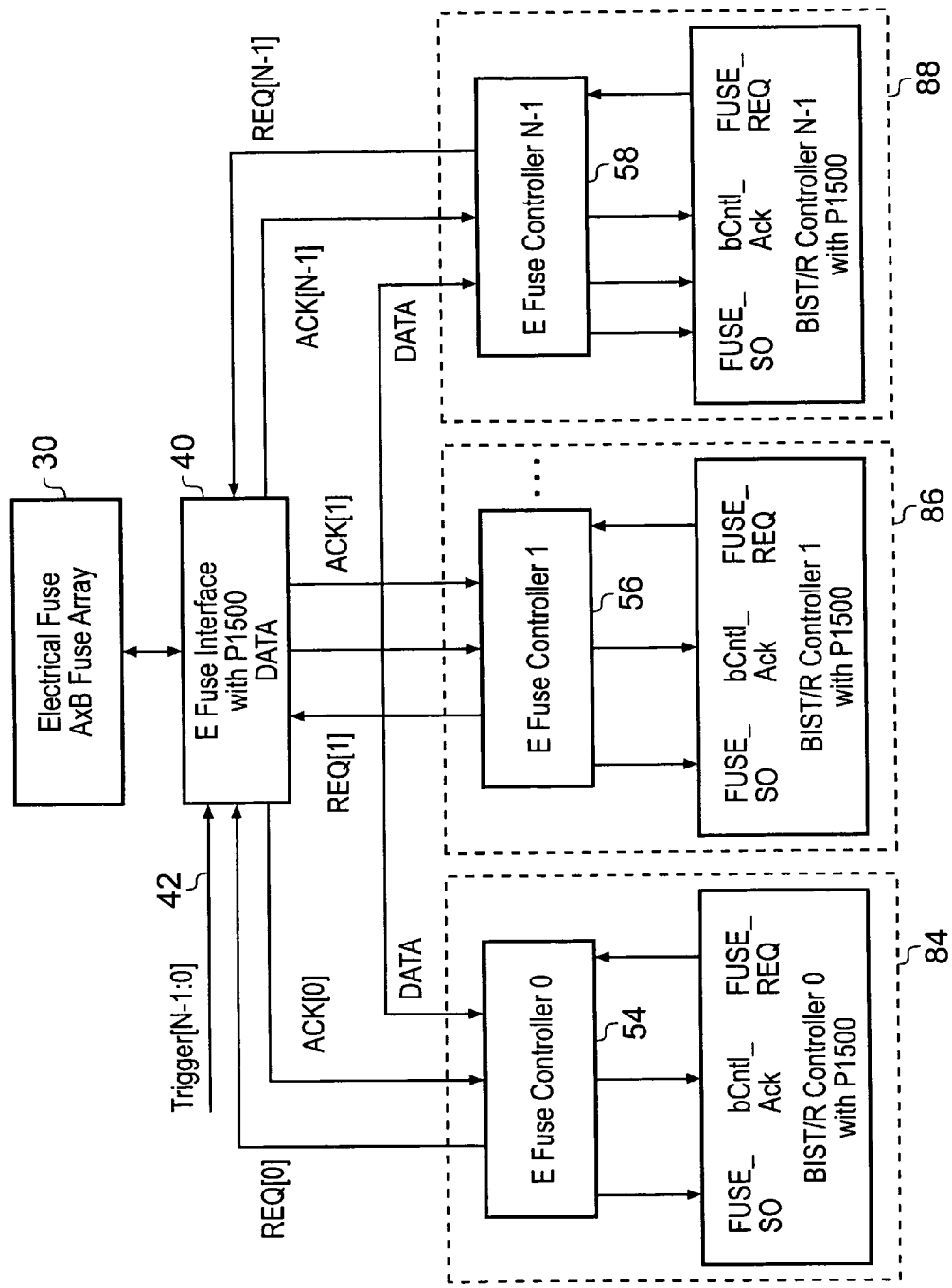
FIG. 3A schematically shows a fusebox, a plurality of memory controllers and associated memories according to a non-limiting, example embodiment.

FIG. 3A shows an example similar to that of FIG. 2 but with a plurality of controllers placed in parallel. FIG. 3A also shows the electrical fuse interface 40 having a trigger input 42. In this example, the data from the electrical fusebox 30 is sent via electrical fuse interface 40 to each of the controllers 54, 56, 58. The controllers 54-58 request this data and if it is to be sent an acknowledge signal is sent from the interface along with the data. Only the fuse controller that receives the acknowledge signal will read the data, the other fuse controllers ignore the data that is sent to them as the absence of the acknowledge signal indicates to them that it is not for them. The E fuse controller that receives the data then expands it and uses it to load the reconfiguration registers in its associated data stores. The E fuse controllers can each shift data to their corresponding wrappers independently and in parallel to the other controllers. Generally as most locations in a memory are good, the data indicating faults is small, and once expanded then this lengthy shifting of data to the wrappers can be performed by each controller independently of and in parallel to the other controllers. Each E fuse controller is within or associated with a memory test controller 84, 86, 88.

In this embodiment there is a trigger signal 42 associated with the E fuse interface 40. This trigger signal is sent via a bus having a number of signals at least equal to the number of the E fuse controllers connected to the E fuse interface. A trigger signal is generated in response to one of these E fuse controllers powering up. This indicates to the E fuse interface that this controller has previously been powered down and now requires all of the reconfiguration data to be sent to it. Thus, it knows if it is half way through sending data to the E fuse controllers that the data for this E fuse controller must be sent from the start. Having triggers for each of the E fuse controllers allows them to be powered down and powered up individually with only reconfiguration data for those E fuse controllers that have been in sleep mode needing to be reloaded. This is a considerable power saving compared to having to reload all of the reconfiguration data to all of the controllers.

Figure 3B:
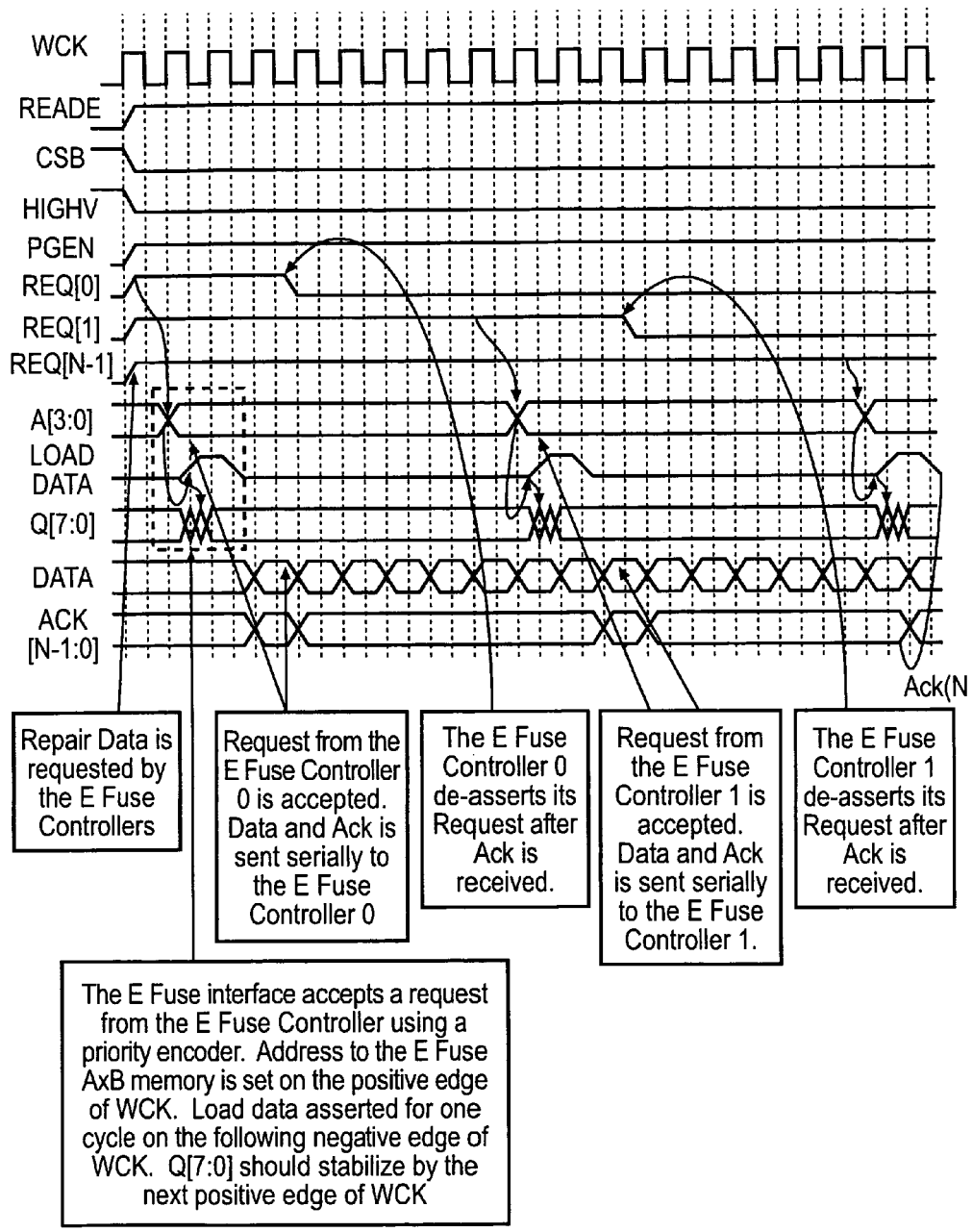
FIG. 3B shows a timing diagram for a system such as that of FIG. 3A.

FIG. 3B shows a timing diagram illustrating the timing relation between the fuse interface 40 and the fuse controllers 54-58 of FIG. 3A.

When the private instruction WLOAD_FUSE_DATA is loaded, the memory test controller requests the fuse data from the fuse controller. A request from the memory test controller to the E fuse controller is made by sending a request pulse on the fusereq port of the E fuse controller 54, 56, 58. Once the request is received by the E fuse controller (assuming the request is received after reset), the E fuse controller sets up the state machine and requests data from the E fuse interface 40.

The E fuse controller 54, 56, 58 waits for the interface ACK pin to go to one. The pin going to one indicates the arrival of the requested data from the E fuse interface 40. The ACK is set to 1 for only one cycle by the E fuse interface 40, and the fuse data arrives on the DATA interface port. The first bit of the fuse data is sent by the E fuse interface 40 in parallel with the interface ACK port being 1. Given the fuse data is latched inside the E fuse controller 54, 56, 58, checking first for interface ACK before taking any new action should not violate the timing constraints.

Each time the E fuse controller 54, 56, 58 makes a request to the E fuse interface 40, 8 bits of data is sent serially. This is except in the case of the initial request from the E fuse controller that results in 9 bits of data. The first bit of the first request represents whether the group of memories requires repair or not. The remaining 8 bits represents the fuse data. If the first bit of the first request is 0 then this means the memories are good. In response to this the reconfiguration register of each wrapper is filled with zeros. Otherwise the actual repair data is loaded in to the reconfiguration register.

Note that although one request from the memory test controller to the E fuse controller is described above, there may be multiple requests from the E fuse controller to the E fuse interface. The reasons for the multiple requests from the E fuse controller to the E fuse interface is that generally not all memories in a group are bad. Statistically approximately 3-4% of the memories require repair. Each time the E fuse controller encounters a memory that requires repair it requests data from the E fuse interface.

As mentioned earlier the E fusebox only stores the information about the memories that require repair. Thus, the E fuse controller generates zeros for the reconfiguration register of the memory wrappers that don't require any repair.

In some embodiments the E fuse controller runs a counter starting from N-1 to 0, where N represents the number of memories in the given group that a particular memory controller is responsible for. After the first data is received from the E fuse interface, the E fuse controller checks to see if the counter value is the same as the value represented in the data received. If so the memory is repairable and fuse data is scanned to the reconfiguration register of that memory. Similarly, as each memory's reconfiguration register is filled, the counter decrements and again checks against the data received from the E fuse interface. Again, if a match occurs requested data is scanned out otherwise zeros are entered.

In some cases the reconfiguration register of a repairable memory may be bigger than the data available in the fuse controller. In such a case a further request is made to the E fuse interface and data is shifted upon receiving it from the E fuse interface. It may also happen that an entire 8 bit packet is sent to the reconfiguration register. In that case, an additional data request is made to the E fuse interface so that the next counter value can be compared against it.

Given that the counter decrements itself, any unused bits should be assigned 1 or at least the number of bits that represent the memories in a group should be assigned 1. For example, if the group contains 8 memories then at least the first 3 (i.e. lg2 8) unused fuses should be set to 1. If the unused fuses are less than the lg2 group size they should still be set to 1. This means that the counter value won't match against the memory position specified in the fuse data, thereby causing the controller to send zeros for the remaining memory wrappers.

Figure 4:
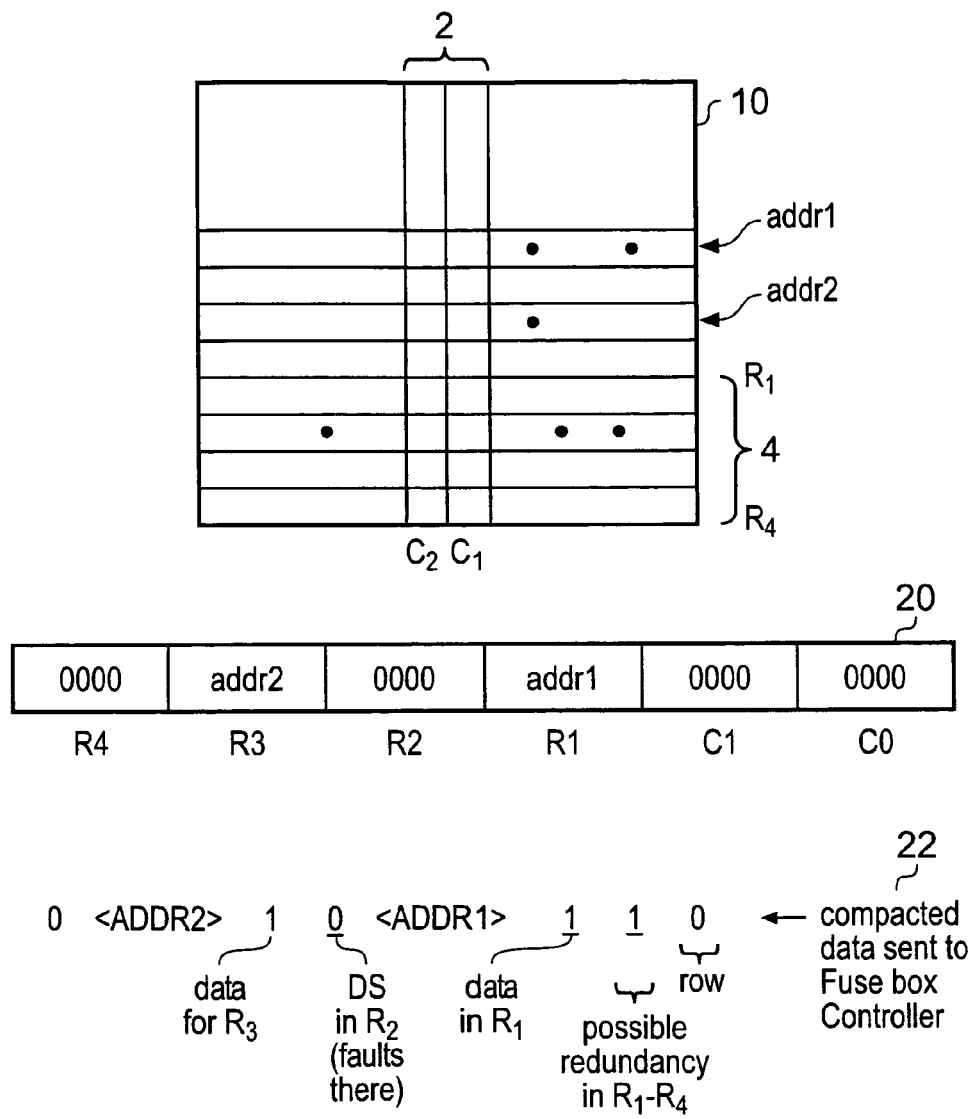
FIG. 4 shows a repairable data store.

FIG. 4 shows a data store 10 that can be repaired using the systems shown in FIGS. 2 and 3. The data store 10 comprise four redundant registers R1 to R4 and two redundant columns C1 and C2. In the examples shown there are faults located in three of the rows that is the row with address 1 the row with address 2 and redundant row R2.

In an initial testing sequence faults within the data store and their locations are identified and this information is stored in the E fuse box. On start up or reset this information is sent from the E fuse box 30 to the E fuse box controller 50 so that the data store 10 can be repaired. This information is sent via a fuse box interface 40 in a compacted form. FIG. 4 shows a form 22 of this compaction. In this embodiment the first number sent represents whether a row or column is involved thus in this case it is a zero which represents a row, the next value represents whether there are redundancies in any of R1 to R4 and it is a 1 so one of those registers is redundant. The next value indicates whether there is data in R1 and it is a 1 so there is. The next addr size (lg 2 # of memory rows) bits are the address 1 which R1 should be filled with. The next bit indicates whether or not there is data in R2 and it is a 0 so there isn't. This is because there is a fault in R2 thus it is not desirable to fill it. The next bit indicates whether there is data for R3 and it is a 1 so there is. The next data is the address to fill R3. The next bit is 0 which indicates that is no data to be stored in R4.

The fusebox controller 50 is aware of the compaction algorithm and also of the size of registers R1 and R2 and thus, it can expand this data using its data expander to fill reconfiguration register 20. This register is filled either with the address of the register that a redundant register is to replace or with 0's if that redundant register is not to be used. Thus, in this case a large reconfiguration register can be filled with little data being sent as if there are no faults or if a redundancy register is itself faulty only one bit in the form of a zero need be sent to indicate this. As the fusebox controller is aware of the size of the redundancy registers no information regarding the number of bits in each address needs to be sent. The reconfiguration register 20 is then used during accesses to the data store to ensure that the faulty columns and rows are not used, the relevant redundant rows and or columns specified in reconfiguration register 20 being used instead.

FIG. 5 shows an example of an E fuse array 110 from within an E fusebox according to a non-limiting, example embodiment. The E fuse array is for repairing a chip having 3 controller groups (indices 0-2), with each group containing 5 memories (indices 0-4). Memories, 0, 2, and 4 are RFS (register files) and 1 and 3 are RAs (register arrays). In this example group 1 is good, while groups 0 and 2 need repair. A group is defined as a set of one memory test controller containing a fuse controller, and plurality of data stores connected to the memory test controller.

In this embodiment RFs have reconfiguration registers of length 5. Their length includes an enable EN bit. The EN bit is not stored in the fuse memory array because if the RF is repairable then E fuse controller itself shifts a 1 for the EN bit, otherwise E fuse controller shifts 0. Regarding RAs, in this embodiment the column repair signature is 6 bits. This length includes the mux factor (0 bit for mux 8, 1 bit for mux 16, 2 bits for mux 32). A column repair length of 6 will have 5 bits stored in the fuse memory array since the EN bit is sent directly by the fuse controller as explained above for the RFs.

The following data is stored in the 16×8 Efuse of FIG. 5. In addition to the above assumptions, we assume memories 1 and 0 require repair in group 2, whereas group 0 contains two repairable memories i.e. 4 and 3.

The data stored in the array of FIG. 5 has the first 3 bits (0-2) of byte 0 to indicate the number of bits to look for once a repairable group is indicated, i.e. the repairable group allocation size. In this case, 4 bits are used once a repairable groups is identified. Since N is 3, it means group 2 requires repair. The next 4 bits indicate how many bytes are used to define the repair data for group 2. In this case it is 6 bytes.

Bit 0 of byte 1 indicates that group N-2 i.e. group 1 does not require repair. Bit 1 of byte 1 indicates that group N-3 (i.e. group 0) requires repair. The next 4 bits indicate that it requires 8 bytes of repair data.

Bits 6-7 of byte 2 (i.e. X) are don't care. It should be noted that the repair data of each group cannot be shared with other information thus, the repair data for group 2 starts from byte 2 and goes to byte 7, and the repair data for group 0 starts from byte 8 and goes up to byte 15.

To further understand the repair data, bits 0-2 of byte 3 (i.e. group 2 data) indicates that memory 1 requires repair. As memory 1 is a register array, bits 3-5 of byte 2 indicate that the failure data refers to the lower order column. Bits 3-5 of byte 3 indicate that one of the four redundant rows of the memory 1 also require repair. The row repair data is 3 bits starting from bit position 7 of byte 3. Bits 4-6 of byte 4 refer to repairable memory 0. Memory 0 is RF and thus the next four bits represent the repair data. Bits 3-5 of byte 5 are marked as 1. They indicate that no more memories require repair in this group. As there were unused fuses for group 2, we set the next 3 bits (log 2 of the number of memories in the controller group) to 1 to indicate that we are finished with this controller group.

Group 0 repair information starts at byte 8. Bits 0-2 of byte 8 denote that memory 4 requires repair. Since memory 4 is RF, the next 4 bits represent memory's repair data. Bit 7 of byte 8 and bits 0-1 of byte 9 indicate the need to repair memory 3. Memory 3 is RA, thus we need to check the next 3 bits to see if the repair is for row or column. As bit 2 of byte 9 is 1, it represents that the repair is for the column. Bit 3 denotes that there are more repairs for memory 3 and bit 4 indicates that higher order column requires repair. The repair column data of 5 bits start from bit 5 of byte 9. Bits 2-4 of byte 10 represents that memory 3 requires row repair. Also bit 4 of byte 10 indicates that there are multiple repairable rows in this RA. The first row repair data is 3 bits long starting from bit 5 of byte 10. Bits 0 of byte 11 denotes the last repair row for memory 3. The repair data of length 3 bits starts at bit 2 of byte 11. Bits 4-6 of byte 11 represent that there are no more repairable memories in this group.

Although illustrative embodiments have been described in detail herein with reference to the accompanying drawings, it is to be understood that the claims are not limited to those precise embodiments, and that various changes and modifications can be effected therein by one skilled in the art without departing from the scope and spirit of the claims.

We claim:

1. An integrated circuit comprising:
   circuitry;
   a fusebox for storing an array of data identifying faulty elements within said circuitry;
   a plurality of fusebox controllers for repairing said faulty elements in said circuitry in response to data received from said fusebox;
   a fusebox interface for controlling communication of said data between said fusebox and said plurality of fusebox controllers;
   a data communication path linking said plurality of fusebox controllers with said fusebox via said fusebox interface; wherein
   data stored in said fusebox is compacted data and said at least one fusebox controller comprises a data expander for expanding said compacted data received from said fusebox via said data communication path prior to repairing any faulty elements in said circuitry; and
   said fusebox interface comprises at least one external port for communicating data to a user, said fusebox interface being configured to read data from said fusebox and to permanently write data to said fusebox in response to instructions received from said at least one external port.

2. An integrated circuit according to claim 1, wherein said circuitry comprises a data store.

3. An integrated circuit according to claim 2, comprising a plurality of data stores, each of said plurality of fusebox controllers being in data communication with at least one data store, said plurality of fusebox controllers being configured to repair faulty elements in said at least one data store that they are in data communication with in response to said data received from said fusebox.

4. An integrated circuit according to claim 3, wherein said plurality of fusebox controllers are arranged in parallel such that they communicate with their respective at least one data store independently of each other.

5. An integrated circuit according to claim 4, wherein each of said plurality of fusebox controllers comprises data store data regarding certain properties of an associated data store, said data expanders in each of said plurality of fusebox controllers being adapted to use said data store data when expanding said compacted data.

6. An integrated circuit according to claim 5, wherein said integrated circuit comprises a plurality of reconfiguration registers associated with said plurality of data stores, said plurality of reconfiguration registers specifying faulty locations and corresponding redundant locations to use as replacement storage locations for said faulty locations said data store data comprising a size of said redundant locations associated with said data store.

7. An integrated circuit comprising:
   circuitry including a plurality of data stores;
   a fusebox for storing an array of data identifying faulty elements within said circuitry;
   a plurality of fusebox controllers, each of said plurality of fusebox controllers being in data communication with at least one respective data store and configured to repair faulty elements in said at least one respective data store that they are in data communication with in response to said fusebox data, said plurality of fusebox controllers being arranged in parallel such that they communicate with their respective plurality of data stores independently of each other
   a data communication path linking the fusebox controllers with said fusebox;
   wherein said data stored in said fusebox is compacted data and said at least one fusebox controller comprises a data expander for expanding said compacted data received from said fusebox via said data communication path prior to repairing any faulty elements in said circuitry, wherein each of said plurality of fusebox controllers comprise a counter for counting a number of data stores controlled by said each of said plurality of fusebox controllers, said each of said plurality of fusebox controllers being adapted to perform the following:

compare said counter value with a value of data received from said fusebox and in response to said value of data being equal, to expand said data and output said data that has been expanded to circuit elements associated with said data store for repairing said faulty elements and if said value of data is not equal to output predetermined values to said circuit elements, said predetermined values being generated by said each of said plurality of fusebox controllers and indicating no repair of said data store, and to increment or decrement said counter and repeat said steps for each of said data stores controlled by said each of said plurality of fusebox controllers.

8. An integrated circuit according to claim 7, wherein said circuit elements associated with said data store comprise reconfiguration registers, said reconfiguration registers specifying faulty locations and corresponding redundant locations to use as replacement storage locations for said faulty locations.

9. An integrated circuit according to claim 1, wherein said at least one external port comprises at least one of a JTAG port and an IEEE 1500 port.

10. An integrated circuit according to claim 1, wherein said circuitry comprises a plurality of data stores and each of said plurality of fusebox controllers are in data communication with at least one of said plurality of data stores, said plurality of fusebox controllers being configured to repair faulty elements in said at least one data store that said plurality of fusebox controllers are in data communication with in response to said fusebox data; and said fusebox interface comprises a plurality of ports corresponding to said plurality of fusebox controllers for sending data to and receiving data from said corresponding plurality of fusebox controllers.

11. An integrated circuit according to claim 10, wherein said fusebox interface comprises a plurality of trigger inputs corresponding to said plurality of fusebox controllers for receiving a trigger signal in response to said corresponding fusebox controller powering up, said fusebox interface being responsive to said received trigger signals to request all of said fusebox data related to said corresponding fusebox controller from said fusebox and to transmit said fusebox data to said fusebox controller.

12. An integrated circuit according to claim 10, wherein said integrated circuit further comprises a plurality of memory test controllers corresponding to said plurality of fusebox controllers for testing each of said at least one of said plurality of data stores in data communication with said corresponding fusebox controller and for generating data identifying said faulty elements in said at least one of said plurality of data stores;

said fusebox interface being configured to write said data generated by said plurality of memory test controllers that has been compacted to said fusebox to permanently store it therein and to retrieve and transmit said compacted data to respective fusebox controllers in response to a reset instruction.

13. An integrated circuit according to claim 12, wherein said integrated circuit comprises at least one external port for outputting said data generated by said plurality of memory test controllers to a compactor and an input port connected to said fusebox interface for receiving said compacted data.

14. An integrated circuit according to claim 12, said integrated circuit further comprising a compactor for compacting said data generated by said plurality of memory test controllers and for transmitting said compacted data to said fusebox interface.

15. An integrated circuit according to claim 12, wherein said plurality of memory test controllers comprise said plurality of fusebox controllers.

16. An integrated circuit according to claim 8, wherein each of said plurality of fusebox controllers and said at least one data store in data communication therewith comprise a group, each of said groups being numbered consecutively and said fusebox being configured to store data compacted such that data for each consecutive group is stored consecutively, a storage location storing a value indicating either at least one faulty element or no faulty elements within a particular group, wherein if said value indicates at least one faulty element a next predetermined number of storage locations indicate repair data size for said particular group, and if said value indicates no faulty elements a next storage location stores a value indicating whether a next group comprises any faulty storage locations, each fusebox controller storing data indicating positions and repair data for repairable data stores in a consecutive list.

17. An integrated circuit according to claim 16, wherein said repair data is stored following said compacted data indicating a number of faults in each of said at least one data store and identifying repairable data stores within each group.

* * * * *